United States Patent
Yen et al.

(10) Patent No.: US 9,236,429 B2
(45) Date of Patent: Jan. 12, 2016

(54) SEMICONDUCTOR STRUCTURE AND MANUFACTURING METHOD THEREOF

(71) Applicant: XINTEC INC., Taoyuan (TW)

(72) Inventors: Yu-Lin Yen, Taipei (TW); Sheng-Hao Chiang, Taipei (TW); Hung-Chang Chen, New Taipei (TW); Ho-Ku Lan, Zhubei (TW); Chen-Mei Fan, Xinfeng Township (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/699,261

(22) Filed: Apr. 29, 2015

(65) Prior Publication Data

US 2015/0318348 A1    Nov. 5, 2015

(30) Foreign Application Priority Data

May 1, 2014 (TW) .............................. 103115723 A

(51) Int. Cl.
*H01L 27/14* (2006.01)
*H01L 29/06* (2006.01)
*H01L 21/762* (2006.01)

(52) U.S. Cl.
CPC ...... *H01L 29/0642* (2013.01); *H01L 21/76229* (2013.01)

(58) Field of Classification Search
CPC .............. H01L 23/3171; H01L 23/481; H01L 27/14618; H01L 27/14683; H01L 27/14685; H01L 27/1462; H01L 21/76898

USPC .................................. 257/431, 774; 438/667
See application file for complete search history.

(56) References Cited

U.S. PATENT DOCUMENTS

| 2005/0095750 A1* | 5/2005 | Lo | H01L 21/56 438/114 |
| 2006/0202348 A1* | 9/2006 | Kameyama | H01L 21/76898 257/774 |
| 2009/0256260 A1* | 10/2009 | Nakamura | H01L 27/14618 257/758 |
| 2010/0090304 A1* | 4/2010 | Liu | H01L 21/76898 257/432 |
| 2011/0169139 A1* | 7/2011 | Lin | H01L 23/481 257/621 |

* cited by examiner

*Primary Examiner* — Trung Q Dang
(74) *Attorney, Agent, or Firm* — Liu & Liu

(57) ABSTRACT

A semiconductor structure includes a substrate, a dam element, a first isolation layer, a second isolation layer, and a conductive layer. The substrate has a conductive pad, a trench, a sidewall, a first surface, and a second surface opposite to the first surface. The conductive pad is located on the second surface. The trench has a first opening at the first surface, and has a second opening at the second surface. The dam element is located on the second surface and covers the second opening. The dam element has a concave portion that is at the second opening. The first isolation layer is located on a portion of the sidewall. The second isolation layer is located on the first surface and the sidewall that is not covered by the first isolation layer, such that an interface is formed between the first and second isolation layers.

12 Claims, 6 Drawing Sheets

SEMICONDUCTOR STRUCTURE AND MANUFACTURING METHOD THEREOF

RELATED APPLICATIONS

This application claims priority to Taiwanese Application Serial Number 103115723, filed May 1, 2014, which is herein incorporated by reference.

BACKGROUND

1. Field of Invention

The present invention relates to a semiconductor structure and a manufacturing method of the semiconductor structure.

2. Description of Related Art

In manufacturing a semiconductor structure of an image sensor, a light transmissive sheet is often arranged on a surface of a wafer, and the light transmissive sheet and the wafer are spaced apart at a distance with a dam element. Thereafter, a V-shaped trench is formed in the wafer by etching.

After the trench is formed, photoresist is used to cover the surface of the wafer facing away from the light transmissive sheet. A portion of the photoresist enters the trench due to the gravity to cover the sidewall of the wafer facing the trench. Afterwards, a portion of the photoresist in the trench and a portion of the dam element under the photoresist are removed by exposure and etching processes. As a result, the photoresist left on the sidewall may be regarded as an isolation layer. Subsequently, a conductive layer can be formed on the isolation layer, so as to be electrically connected to the conductive pad of the wafer.

However, in the typical manufacture of the semiconductor structure, only a single photoresist is used to fill the trench. When the photoresist in the trench is etched, the thickness of the photoresist on the turning point of the wafer adjacent to the trench may become too small to provide desired stress or thickness after applying the conductive layer overlying the photoresist, and thus the reliability of the semiconductor structure is reduced. That is to say, in the manufacture of the typical semiconductor structure it is not easy to control the thickness of the isolation layer, and to flexibly adjust the stress of the isolation layer.

SUMMARY

An aspect of the present invention is to provide a semiconductor structure.

According to an embodiment of the present invention, a semiconductor structure includes a substrate, a dam element, a first isolation layer, a second isolation layer, and a conductive layer. The substrate has a conductive pad, a trench, a sidewall, a first surface, and a second surface opposite to the first surface. The conductive pad is located on the second surface. The trench has a first opening at the first surface, and has a second opening at the second surface. The sidewall faces the trench. The dam element is located on the second surface and covers the second opening. The dam element has a concave portion that is at the second opening. The first isolation layer is located on a portion of the sidewall. The second isolation layer is located on the first surface and the sidewall that is not covered by the first isolation layer, such that an interface is formed between the first and second isolation layers. The conductive layer is located on the first and second isolation layers, and on the concave portion. The conductive layer electrically contacts the conductive pad.

In one embodiment of the present invention, the semiconductor structure further includes a ball grid array. The ball grid array electrically contacts the conductive layer that is on the first surface.

In one embodiment of the present invention, a third surface of the first isolation layer opposite to the sidewall and a fourth surface of the second isolation layer opposite to the sidewall are coplanar.

In one embodiment of the present invention, the substrate is a silicon wafer or a silicon chip.

In one embodiment of the present invention, the semiconductor structure further includes a light transmissive sheet. The light transmissive sheet is located on the dam element, such that the dam element is between the light transmissive sheet and the substrate.

In one embodiment of the present invention, a distance between an end of the first isolation layer adjacent to the first surface and the second surface is smaller than a distance between the first and second surfaces.

Another aspect of the present invention is to provide a manufacturing method of a semiconductor structure.

According to an embodiment of the present invention, the manufacturing method of the semiconductor structure includes the following steps. (a) A dam element is disposed on a substrate. (b) A trench is formed through the substrate, such that the trench has a first opening at a first surface of the substrate, the trench has a second opening at a second surface of the substrate, and a sidewall of the substrate faces the trench. (c) A first isolation layer is formed in the trench, such that a portion of the sidewall is covered by the first isolation layer. (d) A second isolation layer is formed on the first isolation layer, the sidewall that is not covered by the first isolation layer, and the first surface, such that an interface is formed between the first and second isolation layers. (e) A portion of the second isolation layer, a portion of the first isolation layer, and a portion of the dam element in the trench are removed, such that a concave portion is formed in the dam element, and an conductive pad of the substrate is exposed through the concave portion. (f) A conductive layer is formed on the concave portion, the first and second isolation layers, such that the conductive layer electrically contacts the conductive pad.

In one embodiment of the present invention, the manufacturing method of the semiconductor structure further includes forming a ball grid array for electrically contacting the conductive layer that is on the first surface.

In one embodiment of the present invention, the manufacturing method of the semiconductor structure further includes adhering a light transmissive sheet to the dam element, such that the dam element is between the light transmissive sheet and the substrate.

In one embodiment of the present invention, the manufacturing method of the semiconductor structure further includes vertically cutting the conductive layer, the dam element, and the light transmissive sheet along the trench.

In one embodiment of the present invention, step (c) includes forming a curved surface on the first isolation layer facing the first opening.

In one embodiment of the present invention, step (d) includes forming the second isolation layer on the curved surface, such that a position of the interface is the same as a position of the curved surface.

In the aforementioned embodiments of the present invention, after the first isolation layer is formed in the trench, the second isolation layer is formed on the first isolation layer, the sidewall that is not covered by the first isolation layer, and the first surface. As a result of such a design, the second isolation layer is more adjacent to the first opening, such that the second isolation layer on a connection position between the first surface and the sidewall of the substrate is gradual. When a portion of the first isolation layer and a portion of the second isolation layer in the trench are removed, the thickness of the second isolation layer on the connection position between the first surface and the sidewall is easily controlled, not apt to be over decreased. Moreover, the first and second isolation layers may have different stresses in an adjustable manner depending on the design of products. As a result, after the conductive layer is formed on the concave portion, the first and second isolation layers, the peeling of the conductive layer is not prone to occur, thereby improving the reliability of the semiconductor structure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
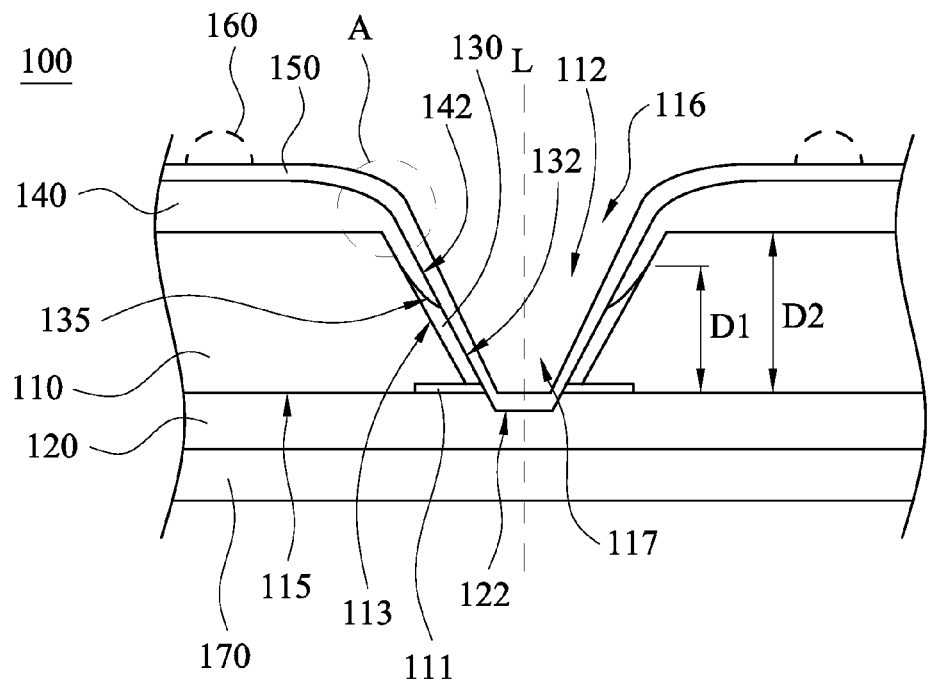
FIG. 1 is a cross-sectional view of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a semiconductor structure 100 according to one embodiment of the present invention. The semiconductor structure 100 includes a substrate 110, a dam element 120, a first isolation layer 130, a second isolation layer 140, and a conductive layer 150. The substrate 110 has a conductive pad 111, a trench 112, a sidewall 113, a first surface 114, and a second surface 115 opposite to the first surface 114. The conductive pad 111 is located on the second surface 115 of the substrate 110. The trench 112 has a first opening 116 at the first surface 114, and has a second opening 117 at the second surface 115. That is to say, the trench 112 is formed through the first and second surfaces 114, 115 of the substrate 110. The sidewall 113 faces the trench 112. The dam element 120 is located on the second surface 115 of the substrate 110 and covers the second opening 117 of the trench 112. The dam element 120 has a concave portion 122. The concave portion 122 is at the second opening 117 and aligned with the trench 112.

Moreover, the first isolation layer 130 is located on a portion of the sidewall 113. The second isolation layer 140 is located on the first surface 114 and the sidewall 113 that is not covered by the first isolation layer 130, such that an interface 135 is formed between the first and second isolation layers 130, 140. In this embodiment, the first isolation layer 130 on the sidewall 113 is more adjacent to the position of the second opening 117, and the second isolation layer 140 on the sidewall 113 is more adjacent to the position of the first opening 116. The conductive layer 150 is located on the first and second isolation layers 130, 140, and on the concave portion 122 of the dam element 120. The conductive layer 150 electrically contacts the conductive pad 111.

When the semiconductor structure 100 is manufactured, the first isolation layer 130 is formed in the trench 112 and covers the dam element 120 in the second opening 117. Thereafter, the second isolation layer 140 is used to cover the first isolation layer 130, the sidewall 113 that is not covered by the first isolation layer 130, and the first surface 114 in the trench 112. Afterwards, the first and second isolation layers 130, 140 may be patterned by etching, and the first and second isolation layers 130, 140 shown in FIG. 1 are obtained.

Before the first and second isolation layers 130, 140 are patterned, since the position of the second isolation layer 140 in the trench 112 is raised by the first isolation layer 130, the second isolation layer 140 on a connection position (i.e., area A) between the first surface 114 and the sidewall 113 is more gradual. As a result, the thickness of the second isolation layer 140 on the connection position between the first surface 114 and the sidewall 113 is easily controlled, not apt to be over decreased.

After the first and second isolation layers 130, 140 are patterned, a third surface 132 of the first isolation layer 130 opposite to the sidewall 113 and a fourth surface 142 of the second isolation layer 140 opposite to the sidewall 113 may be coplanar. For example, an oblique surface formed by the third surface 132 and the fourth surface 142 is attached to the conductive layer 150. Moreover, in this embodiment, a distance D1 between an end of the first isolation layer 130 adjacent to the first surface 114 and the second surface 115 is smaller than a distance D2 between the first and second surfaces 114, 115.

The first and second isolation layers 130, 140 may be made of a material including photoresist. The first and second isolation layers 130, 140 may be different or the same photoresist, and the present invention is not limited in this regard. The first and second isolation layers 130, 140 may have different stresses in an adjustable manner depending on the design of products. After the conductive layer 150 is formed on the concave portion 122, the first and second isolation layers 130, 140, the peeling of the conductive layer 150 is not prone to occur, thereby improving the reliability of the semiconductor structure 100.

In addition, the semiconductor structure 100 may further include a ball grid array 160 and a light transmissive sheet 170. The ball grid array 160 electrically contacts the conductive layer 150 that is on the first surface 114, such that electrical signals may be communicated between the ball grid array 160 and the conductive pad 111. The light transmissive sheet 170 is located on the dam element 120, such that the dam element 120 is between the light transmissive sheet 170 and the substrate 110.

In this embodiment, the substrate 110 may be made of a material including silicon, such as a silicon wafer which is not yet cut to form plural chips. The conductive pad 111 may be made of a material including aluminum. The conductive layer 150 may be made of a material including copper. The ball grid array 160 may be solder balls. The light transmissive sheet 170 may be made of a material including glass or acrylic. However, the present invention is not limited by the aforementioned materials.

Figure 2:
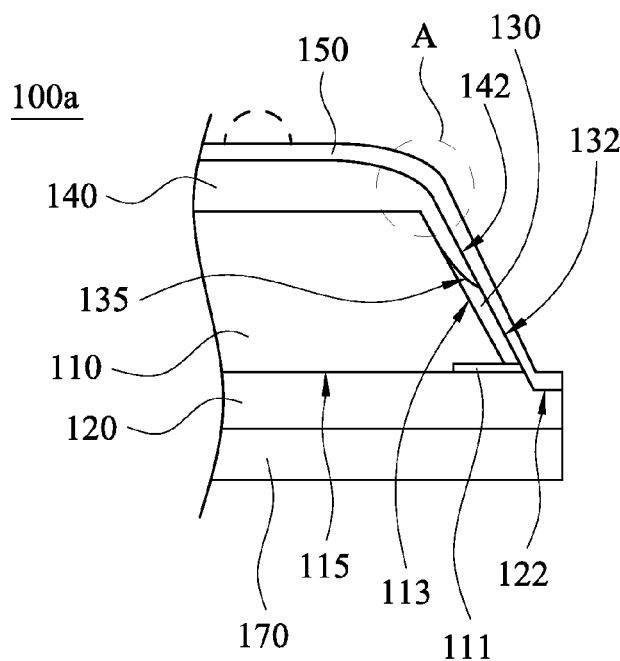
FIG. 2 is a cross-sectional view of a semiconductor structure according to one embodiment of the present invention.

FIG. 2 is a cross-sectional view of a semiconductor structure 100a according to one embodiment of the present invention. The semiconductor structure 100a includes the substrate 110, the dam element 120, the first isolation layer 130, the second isolation layer 140, and the conductive layer 150. The difference between this embodiment and the embodiment shown in FIG. 1 is that the substrate 110 shown in FIG. 2 is a silicon chip. The substrate 110 shown in FIG. 2 is a piece of chips that are formed by a diced wafer. As shown in FIG. 1 and FIG. 2, After the conductive layer 150, dam element 120, and the light transmissive sheet 170 of the semiconductor structure 100 are vertically cut along the trench 112 (e.g., along line L), plural semiconductor structures 100a will be formed. The semiconductor structure 100a may be, but not limited to an image-sensing chip (e.g., CMOS element).

It is to be noted that the connection relationships and materials of the elements described above will not be repeated in the following description. In the following description, the manufacturing methods of the semiconductor structures 100, 100a will be described.

Figure 3:
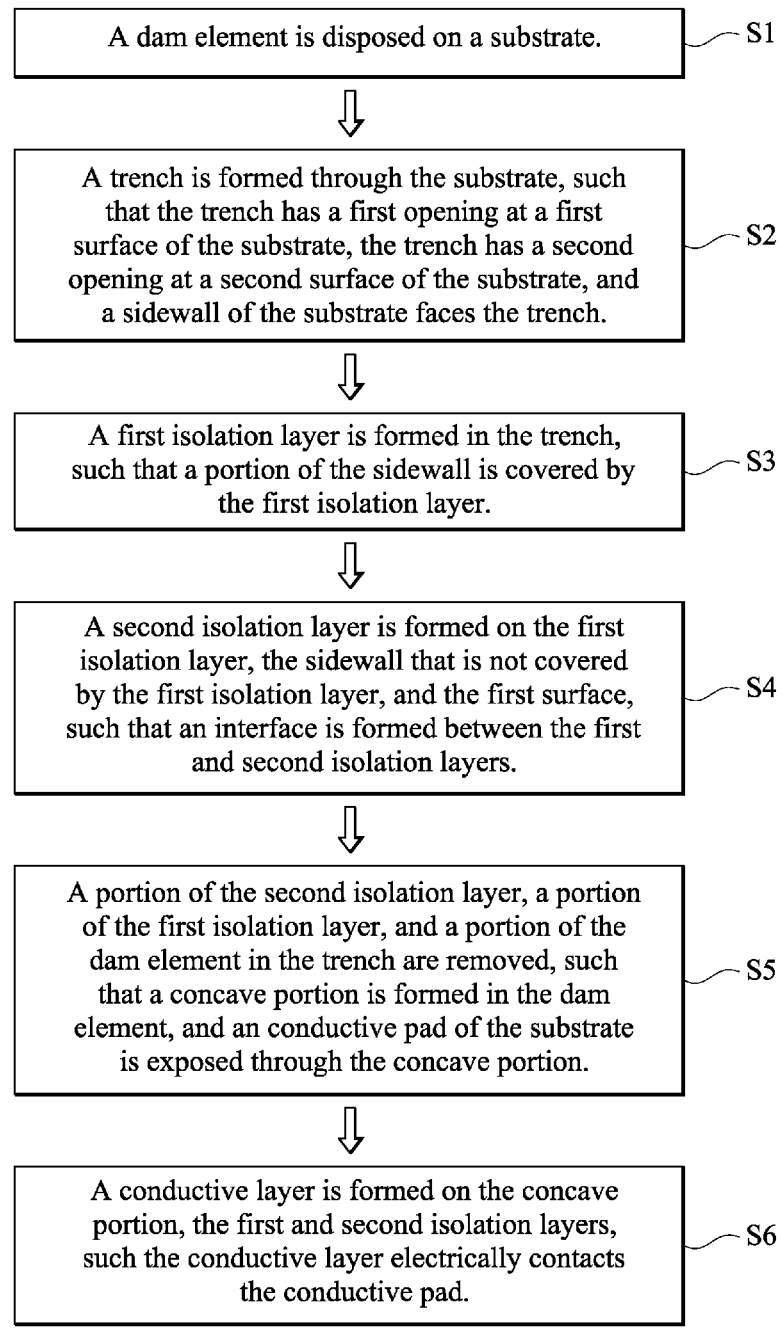
FIG. 3 is a flow chart of a manufacturing method of a semiconductor structure according to one embodiment of the present invention.

FIG. 3 is a flow chart of a manufacturing method of a semiconductor structure according to one embodiment of the present invention. In step S1, a dam element is disposed on a substrate. Thereafter in step S2, a trench is formed through the substrate, such that the trench has a first opening at a first surface of the substrate, the trench has a second opening at a second surface of the substrate, and a sidewall of the substrate faces the trench. Next in step S3, a first isolation layer is formed in the trench, such that a portion of the sidewall is covered by the first isolation layer. Thereafter in step S4, a second isolation layer is formed on the first isolation layer, the sidewall that is not covered by the first isolation layer, and the first surface, such that an interface is formed between the first and second isolation layers. Next in step S5, a portion of the second isolation layer, a portion of the first isolation layer, and a portion of the dam element in the trench are removed, such that a concave portion is formed in the dam element, and an conductive pad of the substrate is exposed through the concave portion. Finally in step S6, a conductive layer is formed on the concave portion, the first and second isolation layers, such the conductive layer electrically contacts the conductive pad.

In the following description, the aforesaid steps in the manufacturing method of the semiconductor structure will be described.

Figure 4:
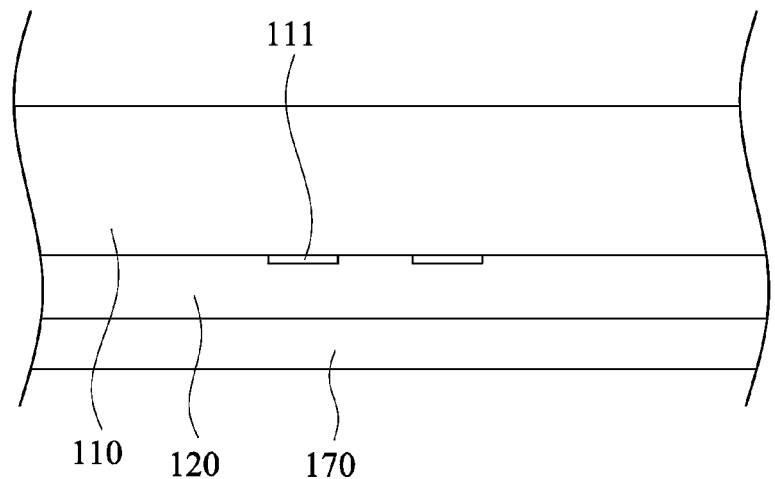
FIG. 4 is a cross-sectional view of a substrate, a dam element, and a light transmissive sheet according to one embodiment of the present invention.

FIG. 4 is a cross-sectional view of the substrate 110, the dam element 120, and the light transmissive sheet 170 according to one embodiment of the present invention. The dam element 120 is disposed on the substrate 110. The light transmissive sheet 170 is adhered to the dam element 120, such that the dam element 120 is between the light transmissive sheet 170 and the substrate 110. When a semiconductor structure is manufactured, the dam element 120 may be adhered to the substrate 110, and thereafter the light transmissive sheet 170 is adhered to the dam element 120. Alternatively, the dam element 120 may be adhered to the light transmissive sheet 170, and thereafter the dam element 120 is adhered to substrate 110.

Figure 5:
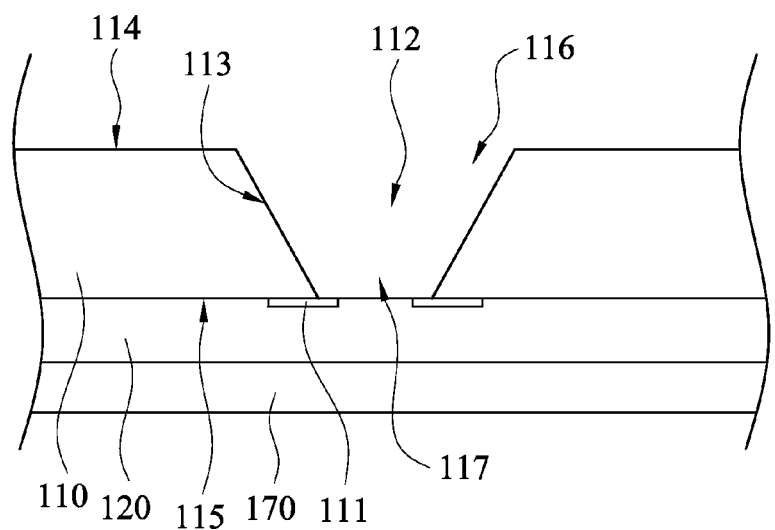
FIG. 5 is a cross-sectional view of a trench after being formed in the substrate shown in FIG. 4.

FIG. 5 is a cross-sectional view of the trench 112 after being formed in the substrate 110 shown in FIG. 4. As shown in FIG. 4 and FIG. 5, after the dam element 120 is disposed on the substrate 110, the trench 112 may be formed through the substrate 110, such that the trench 112 has the first opening 116 at the first surface 114 of the substrate 110, the trench 112 has the second opening 117 at the second surface 115 of the substrate 110, and the sidewall 113 of the substrate 110 faces the trench 112. The trench 112 may be formed by etching the substrate 110, but the present invention is not limited in this regard.

Figure 6:
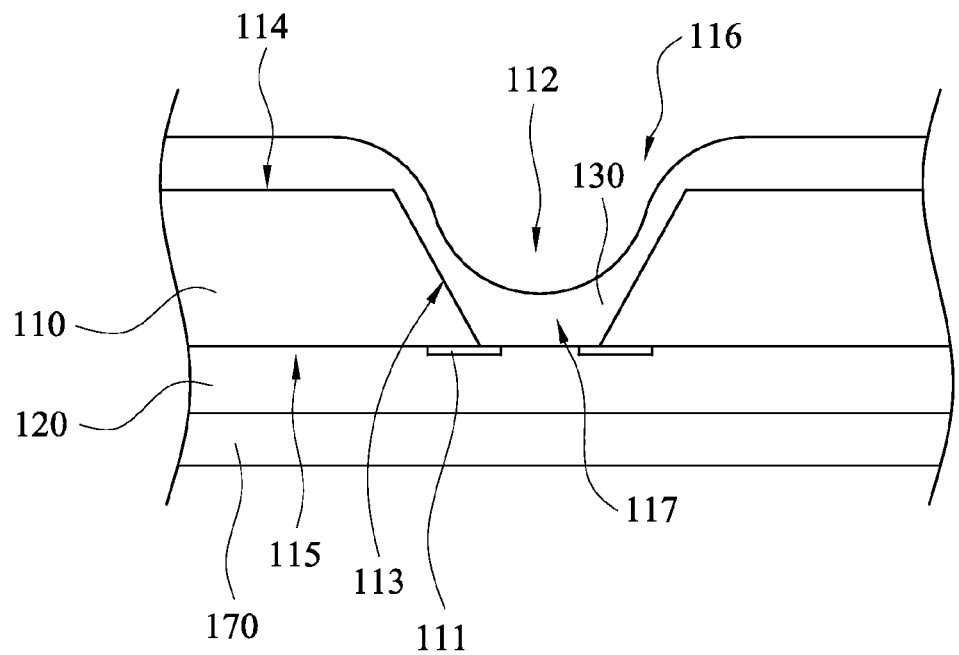
FIG. 6 is a cross-sectional view of a first isolation layer after being formed on the substrate and the dam element shown in FIG. 5.

FIG. 6 is a cross-sectional view of the first isolation layer 130 after being formed on the substrate 110 and the dam element 120 shown in FIG. 5. As shown in FIG. 5 and FIG. 6, after the trench 112 is formed in the substrate 110, the first isolation layer 130 may be formed in the trench 112 and cover the first surface 114 of the substrate 110 by spin coating or spray coating. Since the first isolation layer 130 enters the trench 112, the first isolation layer 130 is recessed in the trench 112.

Figure 7:
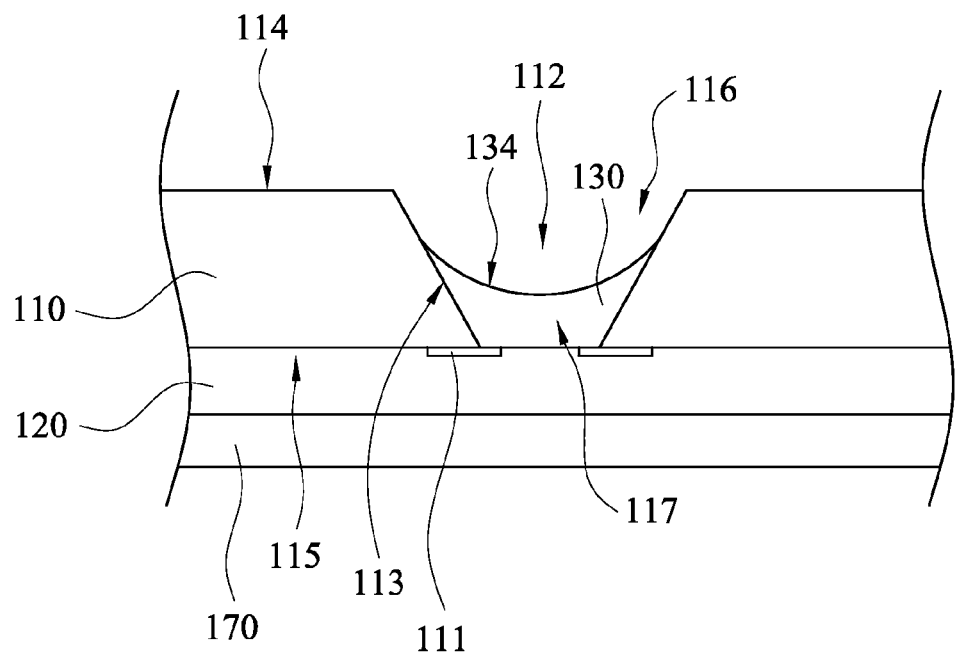
FIG. 7 is a cross-sectional view of the first isolation layer shown in FIG. 6 after being patterned.

FIG. 7 is a cross-sectional view of the first isolation layer 130 shown in FIG. 6 after being patterned. As shown in FIG. 6 and FIG. 7, after the first isolation layer 130 covers the substrate 110 and the dam element 120, the first isolation layer 130 may be patterned by exposure and strip processes, such that only a portion of the sidewall 113 is covered by the first isolation layer 130, and a curved surface 134 on the first isolation layer 130 facing the first opening 116 is formed. The patterned first isolation layer 130 is shown in FIG. 7.

Figure 8:
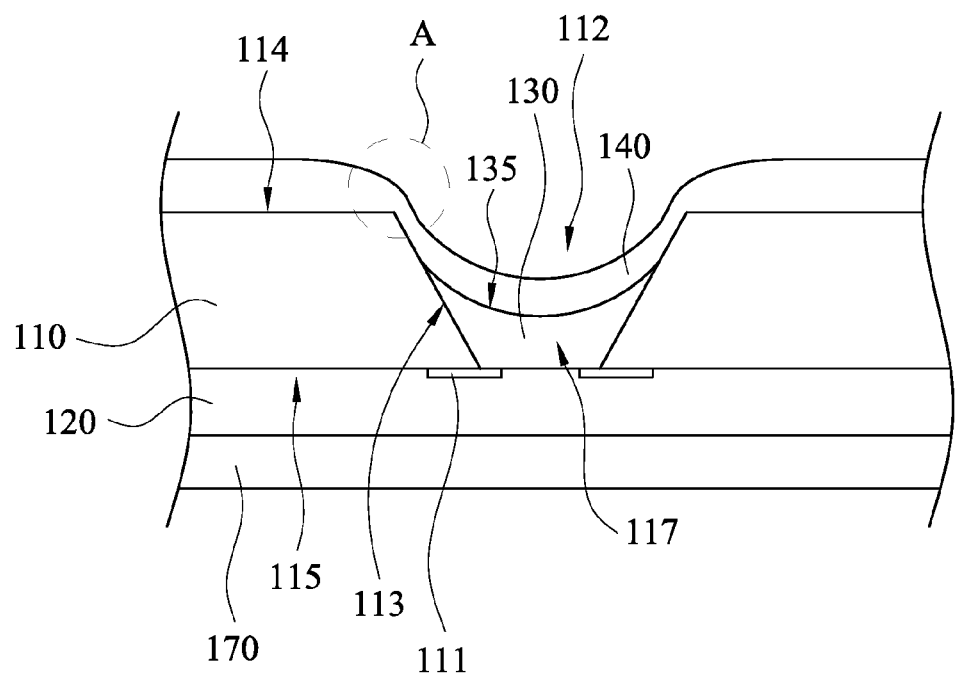
FIG. 8 is a cross-sectional view of a second isolation layer after being formed on the first isolation layer, the sidewall that is not covered by the first isolation layer, and the first surface shown in FIG. 7.

FIG. 8 is a cross-sectional view of the second isolation layer 140 after being formed on the first isolation layer 130, the sidewall 113 that is not covered by the first isolation layer 130, and the first surface 114 shown in FIG. 7. As shown in FIG. 7 and FIG. 8, after the first isolation layer 130 is patterned, the second isolation layer 140 may be formed on the first isolation layer 130, the sidewall 113 that is not covered by the first isolation layer 130, and the first surface 114, such that the interface 135 is formed between the first and second isolation layers 130, 140. The second isolation layer 140 may be also formed by spin coating or spray coating. Since the second isolation layer 140 is formed on the curved surface 134 of the first isolation layer 130 shown in FIG. 7, the position of the interface 135 shown in FIG. 8 is the same as the position of the curved surface 134 shown in FIG. 7.

Figure 9:
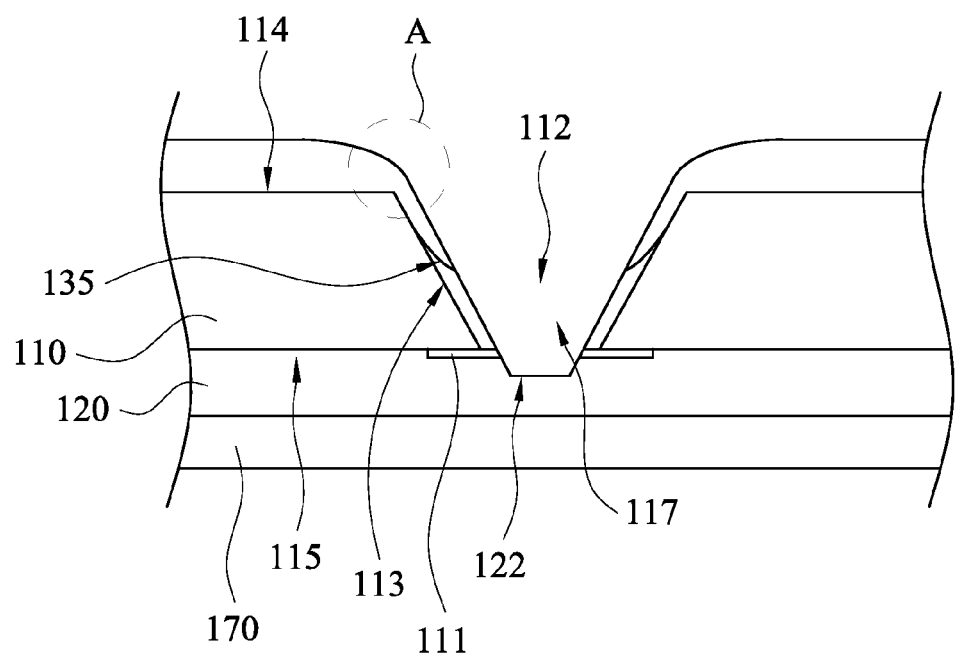
FIG. 9 is a cross-sectional view of a portion of the second isolation layer, a portion of the first isolation layer, and a portion of the dam element in the trench shown in FIG. 8 after being removed.

FIG. 9 is a cross-sectional view of a portion of the second isolation layer 140, a portion of the first isolation layer 130, and a portion of the dam element 120 in the trench 112 shown in FIG. 8 after being removed. As shown in FIG. 8 and FIG. 9, after the second isolation layer 140 covers the substrate 110 and the first isolation layer 130, a portion of the second isolation layer 140, a portion of the first isolation layer 130, and a portion of the dam element 120 in the trench 112 may be removed by photolithography technique (e.g., exposure, development, and etching), such that the concave portion 122 is formed in the dam element 120, and the conductive pad 111 of the substrate 110 is exposed through the concave portion 122. In addition, the interface 135 between the first and second isolation layers 130, 140 that are not removed still exist.

After the first isolation layer 130 is formed in the trench 112, the second isolation layer 140 is formed on the first isolation layer 130, the sidewall 113 that is not covered by the first isolation layer 130, and the first surface 114. As a result of such a design, the second isolation layer 140 is more adjacent to the first opening 116, such that the second isolation layer 140 on the connection position (i.e., area A) between the first surface 114 and the sidewall 113 of the substrate 110 is gradual. When a portion of the first isolation layer 130 and a portion of the second isolation layer 140 in the trench 112 are removed, the thickness of the second isolation layer 140 on the connection position between the first surface 114 and the sidewall 113 is easily controlled, not apt to be over decreased. As a result, the reliability of the semiconductor structure 100 (see FIG. 1) and the reliability of the semiconductor structure 100a (see FIG. 2) may be improved.

Figure 10:
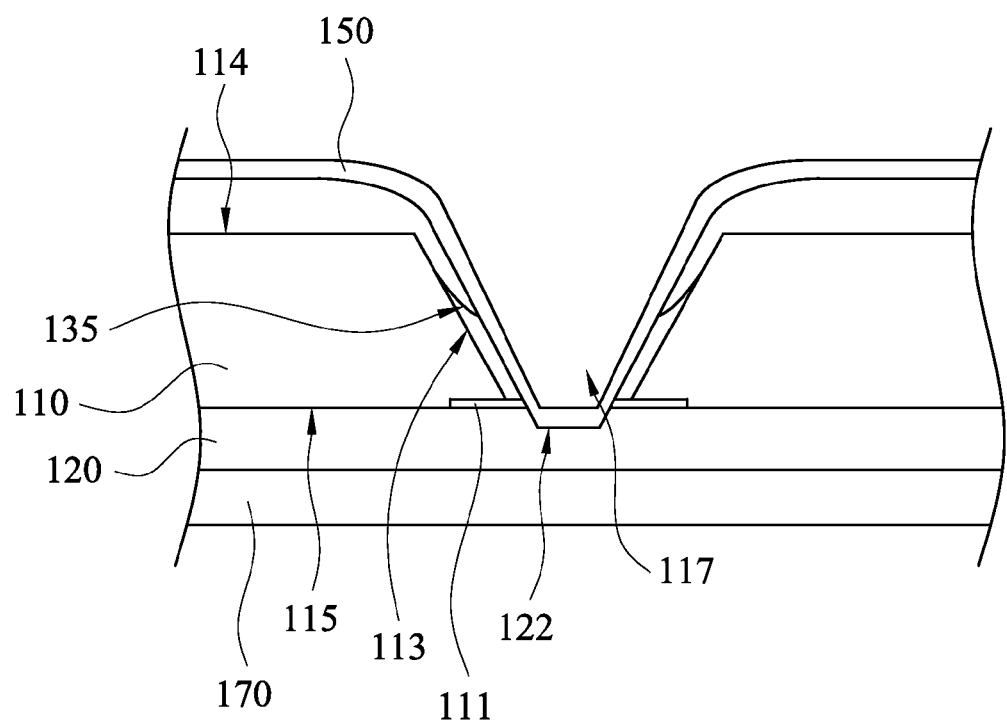
FIG. 10 is a cross-sectional view of a conductive layer after being formed on the concave portion, the first and second isolation layers shown in FIG. 9.

FIG. 10 is a cross-sectional view of the conductive layer 150 after being formed on the concave portion 122, the first and second isolation layers 130, 140 shown in FIG. 9. As shown in FIG. 9 and FIG. 10, after the dam element 120, the first and second isolation layers 130, 140 are patterned, the conductive layer 150 may be formed on the concave portion 122, the first and second isolation layers 130, 140, such the conductive layer 150 electrically contacts the conductive pad 111. The first and second isolation layers 130, 140 may have different stresses in an adjustable manner depending on the design of products. As a result, after the conductive layer 150 is formed on the concave portion 122, the first and second isolation layers 130, 140, the peeling of the conductive layer 150 is not prone to occur, thereby improving the reliability of the semiconductor structure 100 (see FIG. 1) and the reliability of the semiconductor structure 100a (see FIG. 2).

As shown in FIG. 1 and FIG. 10, after the conductive layer 150 is formed on the concave portion 122, the first and second isolation layers 130, 140, the ball grid array 160 may be formed on the conductive layer 150 that is on the first surface 114, such that the conductive layer 150 electrically contacts the ball grid array 160. Thereafter, the conductive layer 150, the dam element 120, and the light transmissive sheet 170 may be vertically cut along the trench 112 (e.g., along line L), thereby forming the semiconductor structure 100a of FIG. 2.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
a substrate having a conductive pad, a trench, a sidewall, a first surface, and a second surface opposite to the first surface, wherein the conductive pad is located on the second surface, the trench has a first opening at the first surface and a second opening at the second surface, and the sidewall faces the trench;
a dam element located on the second surface and covering the second opening, wherein the dam element has a concave portion that is at the second opening;
a first isolation layer located on a portion of the sidewall;
a second isolation layer located on the first surface and the sidewall that is not covered by the first isolation layer, such that an interface is formed between the first and second isolation layers; and
a conductive layer located on the concave portion, the first and second isolation layers, wherein the conductive layer electrically contacts the conductive pad.

2. The semiconductor structure of claim 1, further comprising:
a ball grid array electrically contacting the conductive layer that is on the first surface.

3. The semiconductor structure of claim 1, wherein a third surface of the first isolation layer opposite to the sidewall and a fourth surface of the second isolation layer opposite to the sidewall are coplanar.

4. The semiconductor structure of claim 1, wherein the substrate is a silicon wafer or a silicon chip.

5. The semiconductor structure of claim 1, further comprising:
a light transmissive sheet located on the dam element, such that the dam element is between the light transmissive sheet and the substrate.

6. The semiconductor structure of claim 1, wherein a distance between an end of the first isolation layer adjacent to the first surface and the second surface is smaller than a distance between the first and second surfaces.

7. A manufacturing method of a semiconductor structure, comprising:
(a) disposing a dam element on a substrate;
(b) forming a trench through the substrate, such that the trench has a first opening at a first surface of the substrate, the trench has a second opening at a second surface of the substrate, and a sidewall of the substrate faces the trench;
(c) forming a first isolation layer in the trench, such that a portion of the sidewall is covered by the first isolation layer;
(d) forming a second isolation layer on the first isolation layer, the sidewall that is not covered by the first isolation layer, and the first surface, such that an interface is formed between the first and second isolation layers;
(e) removing a portion of the second isolation layer, a portion of the first isolation layer, and a portion of the dam element in the trench, such that a concave portion is formed in the dam element, and an conductive pad of the substrate is exposed through the concave portion; and
(f) forming a conductive layer on the concave portion, the first and second isolation layers, such the conductive layer electrically contacts the conductive pad.

8. The manufacturing method of the semiconductor structure of claim 7, further comprising:
forming a ball grid array for electrically contacting the conductive layer that is on the first surface.

9. The manufacturing method of the semiconductor structure of claim 7, further comprising:
adhering a light transmissive sheet to the dam element, such that the dam element is between the light transmissive sheet and the substrate.

10. The manufacturing method of the semiconductor structure of claim 9, further comprising:
vertically cutting the conductive layer, the dam element, and the light transmissive sheet along the trench.

11. The manufacturing method of the semiconductor structure of claim 7, wherein step (c) comprises:
forming a curved surface on the first isolation layer facing the first opening.

12. The manufacturing method of the semiconductor structure of claim 11, wherein step (d) comprises:

forming the second isolation layer on the curved surface, such that a position of the interface is the same as a position of the curved surface.

* * * * *